(12) United States Patent
Krupp et al.

(10) Patent No.: US 6,433,728 B1
(45) Date of Patent: Aug. 13, 2002

(54) INTEGRALLY MOLDED REMOTE ENTRY TRANSMITTER

(75) Inventors: Eric Krupp, Canton; John E. McConnell, Ann Arbor; John Nantz, Brighton, all of MI (US)

(73) Assignee: Lear Automotive Dearborn, Inc., Dearborn, MI (US)

( * ) Notice: Subject to any disclaimer, the term of this patent is extended or adjusted under 35 U.S.C. 154(b) by 0 days.

(21) Appl. No.: 09/235,701

(22) Filed: Jan. 22, 1999

(51) Int. Cl.$^7$ .............................................. G08C 19/12
(52) U.S. Cl. ...................... 341/176; 341/173; 361/792; 343/702
(58) Field of Search ................................ 341/173, 176; 455/347; 361/792, 794, 795; 428/300.1, 209; 343/895, 702

(56) References Cited

U.S. PATENT DOCUMENTS

| | | | | |
|---|---|---|---|---|
| 3,596,395 A | * | 8/1971 | Clement et al. ............... | 43/63 |
| 4,939,792 A | | 7/1990 | Urbish et al. | |
| 5,015,519 A | * | 5/1991 | Yumoto ...................... | 429/209 |
| 5,179,601 A | * | 1/1993 | Gotoh .......................... | 385/14 |
| 5,331,325 A | * | 7/1994 | Miller ......................... | 341/176 |
| 5,407,622 A | * | 4/1995 | Clevland et al. ............ | 264/104 |
| 5,448,110 A | | 9/1995 | Tuttle et al. | |
| 5,592,169 A | * | 1/1997 | Nakamura ................... | 341/173 |
| 6,018,326 A | * | 1/2000 | Rudisill ....................... | 343/895 |
| 6,110,576 A | * | 8/2000 | Decker ...................... | 428/300.1 |

FOREIGN PATENT DOCUMENTS

| | | |
|---|---|---|
| EP | 0 704 589 | 4/1996 |
| JP | 0 408 3877 | 3/1992 |
| JP | 0 500 6789 | 1/1993 |

* cited by examiner

*Primary Examiner*—Michael Horabik
*Assistant Examiner*—Albert K. Wong
(74) *Attorney, Agent, or Firm*—Brooks & Kushman P.C.

(57) ABSTRACT

Remote entry transmitters are formed to have a housing element made by a two-shot molding technique. A plateable and a non-plateable plastic are molded in the two-shot molding technique. Circuit trace material is then plated onto the plateable material. This results in a reduction in the number of separate parts for the transmitter. In addition, the antenna is positioned to be non-parallel to the main circuit board. This results in packaging efficiencies and improvements. Preferably, the antenna may be plated onto an inner side wall of the housing when the two-shot molding technique occurs. Alternatively, the antenna may be provided as a separate board.

3 Claims, 2 Drawing Sheets

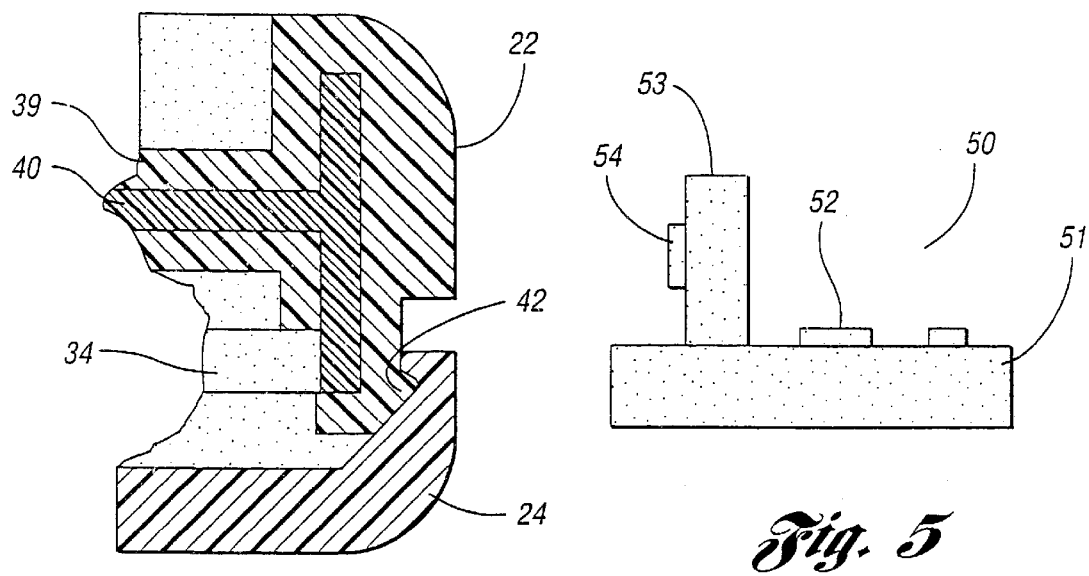
*Fig. 3A.*
*Fig. 5*
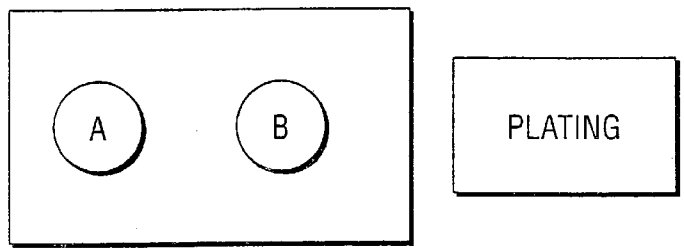
*Fig. 3B*
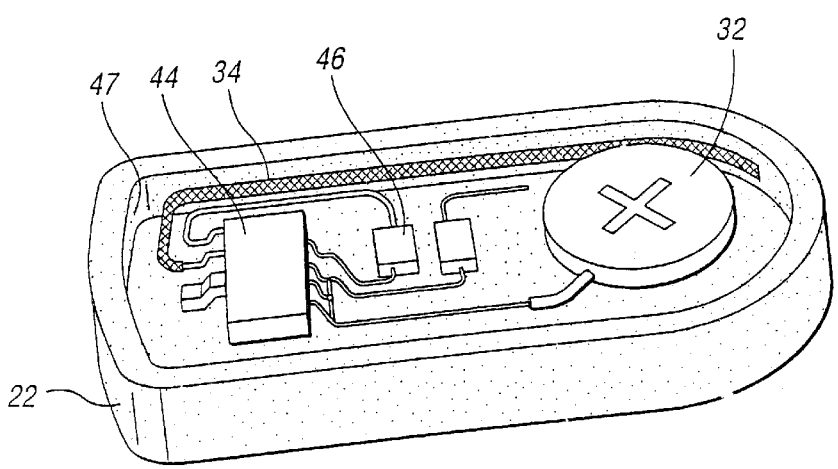
*Fig. 4*

INTEGRALLY MOLDED REMOTE ENTRY TRANSMITTER

BACKGROUND OF THE INVENTION

This invention relates to improvements in the manufacture of remote entry transmitters.

Modern vehicles are often provided with remote entry systems for unlocking the vehicle doors, locking the vehicle doors, unlocking the trunk, etc. from a distance. These devices are desirably made as small as possible. On the other hand, and contrary to the goal of making the transmitters small, it has become desirable to include more and more electrical features into the devices. In addition, the range of the devices is somewhat dependent on the size of the antenna associated with the transmitter. The antennas have typically been relatively long, and have been formed as part of a planar circuit board. Typically, the antennas wrap around the outer periphery of the circuit board, and are parallel to the other circuit traces.

Traditionally these remote entry devices are manufactured by forming two separate plastic housing elements, and sandwiching a circuit board between the two. Switches and other portions are then added to the device. This has required a large number of parts, and several assembly steps.

So-called two-shot molding techniques are known wherein devices are formed by utilizing different plastic materials. Two-shot molding has been proposed for forming electrical components, wherein a plateable and a non-plateable plastic are each molded at different stages in a plastic mold. The plateable material is then provided with a conductive molding to form electrical components. However, these methods have never been applied to remote entry systems.

SUMMARY OF THE INVENTION

In a disclosed embodiment of this invention, a two-shot molding technique is utilized to form one of the main housing components of a remote entry transmitter. The housing component can be integrally plated with circuit traces. This eliminates the need for a separate circuit board, and thus simplifies assembly.

Two-shot molding has typically not been utilized to provide an outer housing element which must have an aesthetically desirable appearance. Typically, the two-shot molding techniques have been for hidden elements. The present invention now utilizes the two-shot molding for an outer surface, which is distinct from the prior art. Moreover, the two-shot molding techniques have never been utilized for remote entry systems. Both of these are improvements over the prior art, and result in the reduction in the number of elements associated with the remote entry systems.

In another feature of this invention, the antenna is formed to extend generally perpendicularly to the main circuit board. This feature is separately distinct and patentable from the two-shot molding, although in one embodiment it is also incorporated into a two-shot molded system.

The antenna is most preferably molded along an inner wall of the housing member. Thus, the size and space that had previously been required for the antenna to extend parallel to the circuit board is no longer necessary. Instead, the antenna is now placed on a surface area, the sidewall, which had not previously been utilized for any electrical components. In this way, the size of the remote transmitter can be made smaller.

In a second embodiment, the antenna is formed on a separate board which is attached to the main circuit board, and which also extends perpendicularly to the main circuit board. More generally, this aspect of the invention is placing the antenna at a non-parallel angle to the plane of the circuit board.

These and other features of the present invention can be best understood from the following specification and drawings, the following of which is a brief description.

BRIEF DESCRIPTION OF THE DRAWINGS

FIG. 1B is a cross-sectional view through FIG. 1a.

FIG. 3 is a view along the circle 3 of FIG. 1B.

FIG. 4 shows another feature of one embodiment of the present invention.

FIG. 5 shows a second embodiment of the present invention.

DETAILED DESCRIPTION OF PREFERRED EMBODIMENTS

Figure 1A:
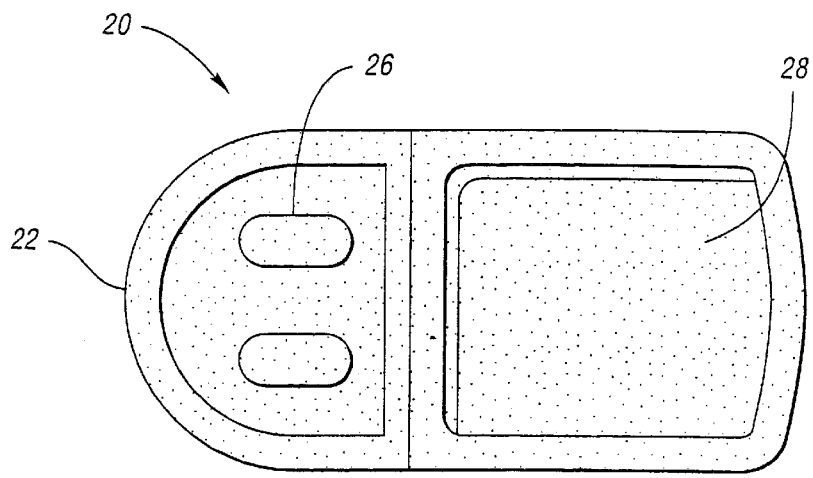
FIG. 1A shows a remote entry transmitter.

A remote entry transmitter, or key fob, as they are typically known, is shown in FIG. 1A. An outer housing 22 has a textured surface, or other surface which provides a pleasing visual appearance. A signalling portion 26 includes a plurality of switches that allow an operator to request various functions from the transmitter 20.

Figure 1B:
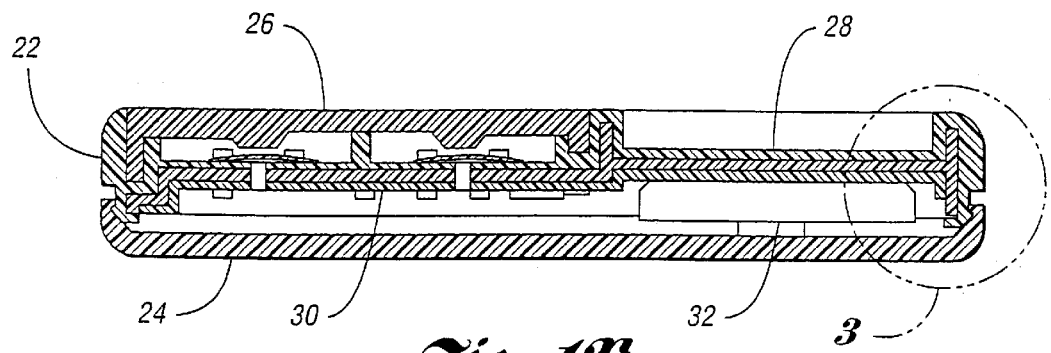

FIG. 1B is a cross-sectional view through the transmitter 20. As shown, an outer housing 22 is connected to a bottom cover 24. A switch cover 26 is connected to the housing 22. A surface 28 may be provided to form a portion of the housing 22. Circuit traces 36 are integrally formed with the housing 22. A battery 32 is in contact with the circuit traces 36.

Figure 2:
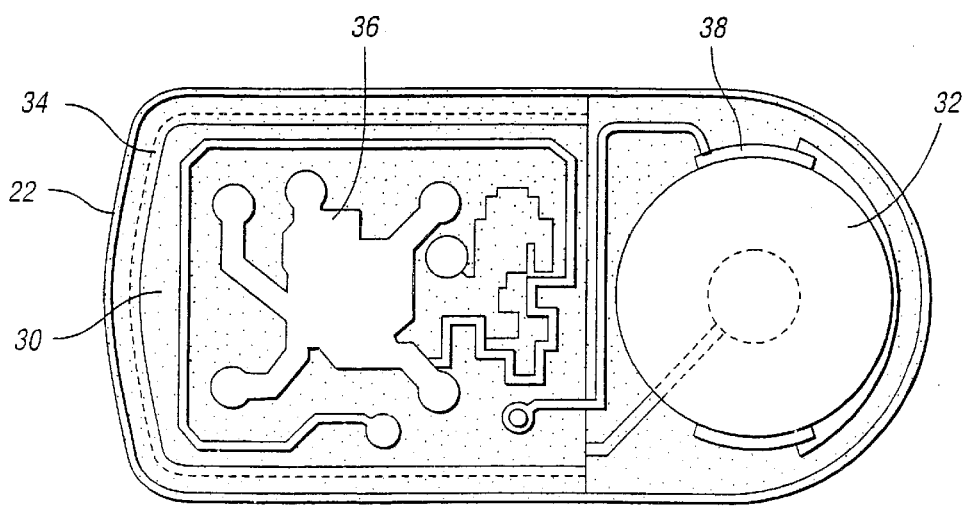
FIG. 2 is a bottom view of the remote entry transmitter.

As shown in FIG. 2, the circuit traces 30 incorporate an antenna 34 extending around the outer periphery of the outside wall of the housing. Further, circuit traces 36 are formed on the main circuit 30. Battery clips 38 which may hold the battery, and also form the contacts, are integrally formed with the housing 22, and hold the battery 32.

As shown in FIG. 2, the circuit traces 36 incorporate an antenna 34 extending around the outer periphery of the outside wall of the housing. Further, circuit traces 36 are formed on the main circuit 30. Battery clips 38 which may hold the battery, and also form the contacts, are integrally formed with the housing 22, and hold the battery 32.

As shown in FIG. 3B, a mold 80 has areas A and B. Area A may be utilized to form the plateable portion of the housing 22. Area B then injects a second plastic which is non-plateable. From area B the housing 22 can be taken to a place wherein the conductive material to form the traces 36 and 34 are then placed onto the plateable material. The conductive material does not stick to the non-plateable material. This two-shot molding technique is known in the prior art. However, it has not been utilized for forming remote entry transmitters. Moreover, it has not been utilized to form the decorative outer surfaces such as are found at several areas in the housing 22.

As shown in FIG. 4, the housing 22 may include electrical elements 44 and 46 which snap into the circuit traces 36. The function of the elements 44 and 46 may be as known. One element would be an R transmitter for sending a signal to a vehicle based receiver. It is the manufacture of the circuit traces by the two-shot molding technique which is inventive. Further, the positioning of the antenna 34 on the side wall 47 is also inventive. Again, the antenna 34 may be formed by the two-shot molding technique. The positioning of the antenna to extend generally perpendicular to the main surface of the traces 36 and the circuit 30 provides packaging benefits. In the past, the antenna 34 has been generally planar and parallel to the circuit board. By positioning the antenna non-parallel to the circuit board, less size is required. Moreover, the sidewall 47 has been necessary to provide clearance for elements such as elements 44 and 46. However, its surface area has not been used for positioning electrical components. Thus, by forming the antenna on that sidewall better packaging is achieved.

FIG. 5 shows another embodiment 50 wherein a first circuit board 51 has the main circuit traces 52. A second circuit board 53 is plugged into circuit board 51 and includes the antenna 54. By positioning the circuit board 54 at a non-parallel angle (here perpendicular) the packaging benefits described above can be achieved.

Preferred embodiments of this invention have been disclosed; however, a worker of ordinary skill in the art would recognize that modifications would come within the scope of this invention. For that reason, the following claims should be studied to determine the true scope and content of this invention.

What is claimed is:

1. A remote entry transmitter housing comprising:

a housing;

a battery and a transmitter for transmitting a signal, and received in said housing, a main circuit being disposed generally in a first plane, and an antenna communicating with said transmitter, said antenna being disposed generally non-parallel to said plane of said main circuit, wherein said housing having a side wall, and said antenna being integrally formed on an inner portion of said side wall.

2. A housing as recited in claim 1, wherein said main circuit is also molded onto said housing along with said antenna.

3. A remote entry transmitter housing comprising:

a housing;

a battery and a transmitter for transmitting a signal, and received in said housing, a main circuit being disposed generally in a first plane, and an antenna communicating with said transmitter, said antenna being disposed generally non-parallel to said plane of said main circuit, wherein said antenna is integrally formed on a separate circuit board which is attached to said main circuit.

* * * * *